US006556492B2

United States Patent
Ernst et al.

(10) Patent No.: US 6,556,492 B2
(45) Date of Patent: Apr. 29, 2003

(54) SYSTEM FOR TESTING FAST SYNCHRONOUS SEMICONDUCTOR CIRCUITS

(75) Inventors: Wolfgang Ernst, München (DE); Gunnar Krause, München (DE); Justus Kuhn, München (DE); Jens Lüpke, München (DE); Jochen Müller, München (DE); Peter Pöchmüller, München (DE); Michael Schittenhelm, Poing (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/907,695

(22) Filed: Jul. 18, 2001

(65) Prior Publication Data

US 2002/0012283 A1 Jan. 31, 2002

(30) Foreign Application Priority Data

Jul. 18, 2000 (DE) .......................... 100 34 899

(51) Int. Cl.[7] .............................. G11C 7/00; G11C 29/00
(52) U.S. Cl. ........................ 365/201; 365/233; 365/194
(58) Field of Search ................................ 365/201, 194, 365/210, 233; 324/754; 714/738

(56) References Cited

U.S. PATENT DOCUMENTS 5,396,170 A * 3/1995 D'Souza et al. ......... 324/158.1
5,600,257 A * 2/1997 Leas et al. ................. 324/72.5
5,614,855 A * 3/1997 Lee et al. ................... 327/156
5,933,379 A * 8/1999 Park et al. .................. 365/201
6,133,744 A * 10/2000 Yojima et al. .............. 324/754

FOREIGN PATENT DOCUMENTS

DE           19534735 A1      3/1996

OTHER PUBLICATIONS

English Abstract of Japanese Patent No. 05264667 A, Kano Masayuki, Oct. 12, 1993.

* cited by examiner

*Primary Examiner*—Richard Elms
*Assistant Examiner*—Jung H. Hur
(74) *Attorney, Agent, or Firm*—Laurence A. Greenberg; Werner H. Stemer; Ralph E. Locher

(57) ABSTRACT

The system enables testing fast synchronous semiconductor circuits, particularly semiconductor memory chips. Various test signals such as test data, data strobe signals, control/address signals are combined to form signal groups and controllable transmit driver and receiver elements allocated to them are in each case jointly activated or, respectively, driven by timing reference signals generated by programmable DLL delay circuits. A clock signal generated in a clock generator in the BOST semiconductor circuit is picked up at a tap in the immediate vicinity of the semiconductor circuit chip to be tested and fed back to a DLL circuit in the BOST chip where it is used for eliminating delay effects in the lines leading to the DUT and back to the BOST.

10 Claims, 1 Drawing Sheet

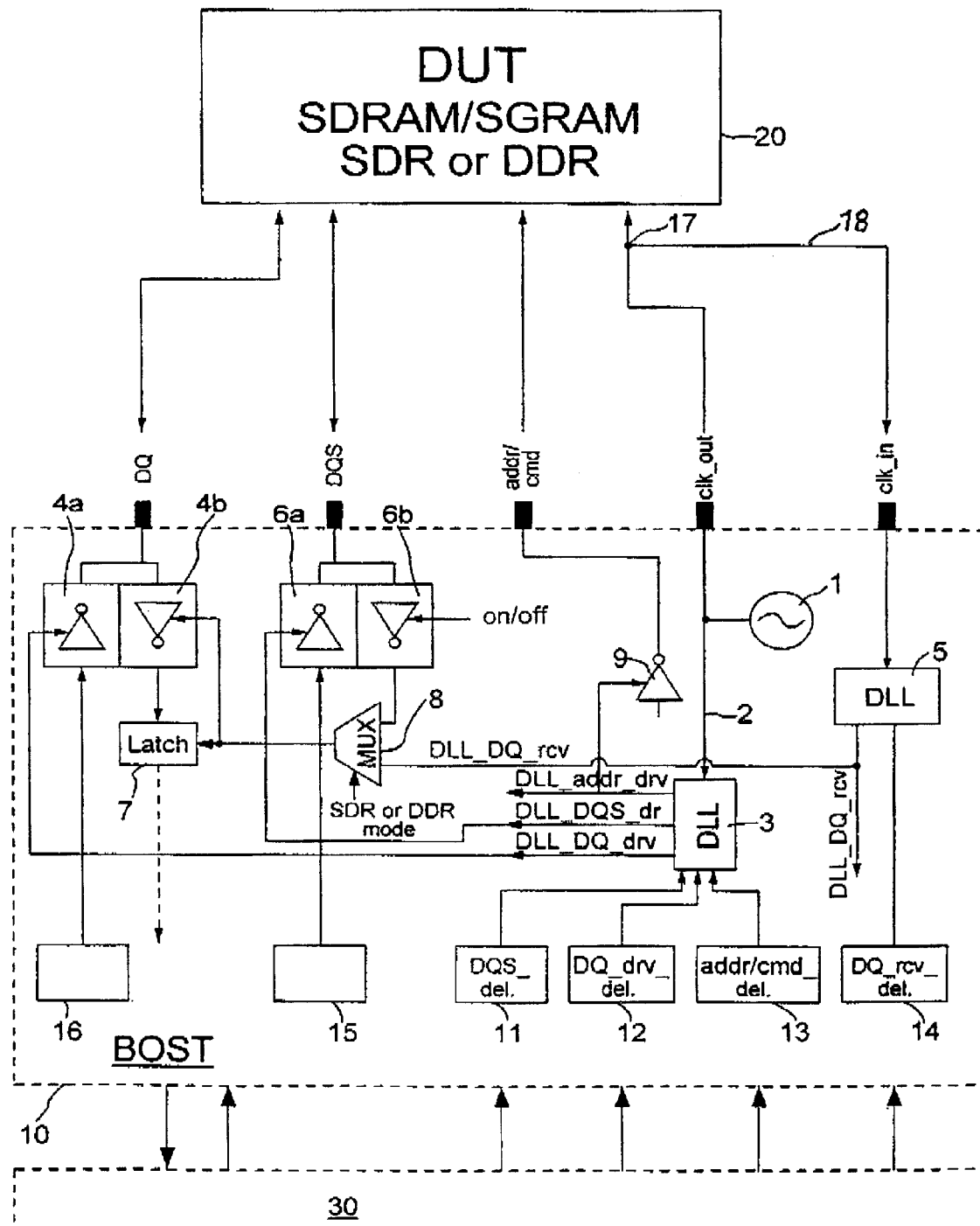

SYSTEM FOR TESTING FAST SYNCHRONOUS SEMICONDUCTOR CIRCUITS

BACKGROUND OF THE INVENTION

Field of the Invention

The invention lies in the field of semiconductor circuit technology and it pertains, more specifically, to a system for testing fast synchronous semiconductor circuits, particularly semiconductor memory chips, in which test signals such as test data, control, address and timing reference or clock signals (DQ, DQS, addr, cmd, clk_out) are generated on the basis of signal conditions input by the testing device, supplied to the circuit to be tested and evaluated by the latter in dependence on response signals generated by the test signals. A timing reference circuit is provided for generating timing reference signals, the phase angle of which can be programmed, as timing reference for the test signals to be generated and the response signals from the semiconductor circuit to be tested, which are to be evaluated.

A test system of that type is known from U.S. Pat. No. 6,032,282 (see also German published patent application DE 195 34 735 A1). Modern DRAM (Dynamic Random Access Memory) chips are tested by means of costly production testing device. The latter allow signals having precisely defined voltage levels to be applied to the memory chip or DUT (Device Under Test) to be tested at precisely defined times. During the checking of the read function of the DUT, it is also possible to read signals coming from the DUT into the test equipment at precisely defined times and to compare them with expected signal values.

Due to the high frequencies of current memory chips, such as, for example, 400 megahertz clock frequency in the case of Rambus DRAMs, the specification of these chips requires a high timing accuracy of the signals (in the case of DDR (Double Data Rate) memories, signal specifications of the order of magnitude of 500 ps are already currently used). For this reason, production testing devices must in some cases meet the highest technical requirements which leads to correspondingly high costs. Current DRAM production test equipment cost several million dollars. For this reason, the costs of testing extremely high frequency memory chips already amount to up to 30% of the total production costs.

At present, no proposal for testing fast SGRAM or DRAM memory chips is known which, using low-frequency, more inexpensive production test equipment hitherto used, would, nevertheless, provide a highly accurate measurement of the signals read out of a DUT. Memories are still being tested in the traditional way by means of highly complex and expensive production test equipment. Known production test equipment provides a large number of independent input/output channels which are generally freely programmable individually. The various input/output channels are compared relative to an internal timing reference of the testing device and with data patterns generated in the testing device. For this reason, the various input/output channels are driven with numerous ASIC chips and electronic components via complex pin cards.

U.S. Pat. No. 6,032,282 describes a clock edge shaping circuit for use in an IC test system. In that system, a pattern generating device provides test patterns on the basis of signal conditions input by a testing device for a clock signal to be supplied to a circuit to be tested, the front and back edge of which signal can be shaped programmably by the prior art clock edge shaping circuit. Response signals generated in dependence on the test signals are evaluated. It is thereby also possible to synchronize the expected patterns for a comparison with the signals obtained from a tested chip. It must be emphasized that the clock edge shaping circuit known from the published document is used in semiconductor IC test equipment and is not a component of an additional semiconductor chip which is inserted into the signal path between test equipment and a semiconductor chip to be tested or DUT.

Japanese published patent application JP 05-264,667 A describes a test circuit which receives a slow clock signal CKT and generates from this a high-speed clock signal by means of a frequency multiplier. In this arrangement, slow test data are converted into fast test data by means of selectors, parallel-serial converters and multiplexers, and are output to a circuit operating at high clock frequency. The result data of this circuit are converted into slow output data by means of multiplexers, serial/parallel converters and selectors. The test circuit known from this printed document is integrated in a LSI circuit and, accordingly, does not form a separate semiconductor circuit chip which is inserted between test equipment and a semiconductor circuit to be tested and is spatially associated with the semiconductor circuit to be tested.

SUMMARY OF THE INVENTION

It is accordingly an object of the invention to provide a system for testing fast synchronous semiconductor circuits, which overcomes the above-mentioned disadvantages of the heretofore-known devices and methods of this general type and which test system, in particular, is designed for a test of high-frequency DRAMs, in such a manner that the hitherto complicated DUT interface and other components can be greatly simplified or, respectively, reduced, that the functions according to the invention can be implemented in a single semiconductor chip, and that the more inexpensive production test equipments hitherto used can still be used.

With the foregoing and other objects in view there is provided, in accordance with the invention, a system for testing fast synchronous semiconductor circuits, in particular semiconductor memory chips. The system comprises:

a testing device connected via a signal path to a semiconductor circuit to be tested, wherein the semiconductor circuit to be tested is connected to receive test signals selected from the group consisting of test data signals, control signals, address signals and timing reference and clock signals generated in dependence on signal conditions defined by the testing device, and wherein the semiconductor circuit to be tested generates response signals in response to the test signals; and a semiconductor circuit chip connected in the signal path between the testing device and the semiconductor circuit to be tested and spatially associated with the semiconductor circuit to be tested, the semiconductor circuit chip containing a timing reference circuit for generating timing reference signals with a programmable phase angle and forming a timing reference for the test signals and the response signals, and circuits for generating the test signals and for evaluating the response signals received from the semiconductor circuit being tested.

In other words, the objects are achieved with a test system with a separate semiconductor chip (BOST chip), which is spatially associated with the semiconductor circuit to be tested, is inserted into the signal path between the test equipment and the semiconductor circuit to be tested and contains the timing reference circuit and circuit means for generating the test signals and for evaluating the response signals from the semiconductor circuit to be tested.

In this configuration, a clock signal used by the timing reference circuit for generating the timing reference signals can be generated either internally by a clock generator located in the BOST chip or derived from a highly accurate basic clock signal generated externally.

In the BOST chip, first controllable transmit driver and receiver elements for data words which are written to the DUT by the BOST chip and data words which are read out of the DUT by the BOST chip are provided and the timing of these first controllable transmit driver and receiver elements can be controlled by a first and a second timing reference signal which is in each case generated by the timing reference circuit.

The BOST chip also has second controllable transmit driver elements for addresses and command signals to be sent to the DUT, and the timing of the second transmit driver elements can be controlled by a third timing reference signal generated by the timing reference circuit. Furthermore, third controllable transmit driver and receiver elements for data strobe signals which are written to the DUT by the BOST chip and data strobe signals which are read out of the DUT by the BOST are provided in the BOST chip. The timing of these third transmit driver and receiver elements can be controlled by a fourth timing reference signal generated by the timing reference circuit.

The timing reference circuit preferably and advantageously has a first DLL circuit (delay-locked loop circuit) with programmable delay.

For this purpose, storage registers can be provided in the BOST chip, in each case for storing a programming value for programming the delay of the DLL circuit. These storage registers can be preferably loaded with a start or base value by the test equipment.

Since the timing of the data words read out of the DUT by the BOST chip and received by the receiver elements is specified with respect to the clock signal supplied to the DUT by the BOST chip, the clock signal generated by the BOST chip and output to the DUT is preferably picked up by a signal tap close to the DUT and fed back to the DLL circuit in the BOST chip by means of circuit means so that the correct arrival in time of the data word signals at the BOST chip is measured with maximum accuracy with respect to the clock signal fed back, by means of this feedback of the timing reference which has the same development in time as the data words read from the DUT. For this purpose; a second delay-locked loop circuit DLL is connected to the clock signal fed back in the BOST chip. This DLL circuit allows a programmable delay signal to be generated for latching in, accurately timed, the data word response signals from the DUT received from the DUT by the first receiver elements.

With the BOST concept, the proposed test system provides for an inexpensive solution since a BOST chip containing the functional units necessary for implementing the proposed test system can be produced very inexpensively in comparison with the high costs of current highly accurate production test equipments and provides for placement close to the DUT which makes for higher accuracy of the test.

It should be noted that the test system according to the invention with the proposed BOST solution is not only suitable for testing very fast synchronous DRAM and SGRAM chips in single-data-rate (SDR) mode or in double-data-rate (DDR) mode but also for testing other synchronous digital semiconductor circuits since the proposed concept provides for the highly accurate measurement of data signals on the basis of the timing reference signals generated in the BOST.

Other features which are considered as characteristic for the invention are set forth in the appended claims.

Although the invention is illustrated and described herein as embodied in a system for testing fast synchronous semiconductor circuits, it is nevertheless not intended to be limited to the details shown, since various modifications and structural changes may be made therein without departing from the spirit of the invention and within the scope and range of equivalents of the claims.

The construction of the invention, however, together with additional objects and advantages thereof will be best understood from the following description of the specific embodiment when read in connection with the accompanying drawing.

BRIEF DESCRIPTION OF THE DRAWING

The sole FIGURE is a block diagram illustrating an embodiment of the invention.

DESCRIPTION OF THE PREFERRED EMBODIMENT

Referring now to the sole FIGURE of the drawing in detail, there is shown, in the form of a block diagram, the architecture and various circuit elements which essentially represent a DUT interface in a BOST chip 10. The signals to be driven or, respectively, to be measured by the BOST chip 10 are subdivided into the groups DQ, which are data words which are written to the DUT 20 or are read from it, DQS, which are data strobe signals for DDR mode and other memory concepts, address/command signals addr/cmd to the DUT 20, and clock signals "clk_out" and "clk_in".

The exemplary BOST chip 10 has a clock generator 1 by means of which the clock signal clk_out is generated. As an alternative, the clock signal clk_out can also be derived from a basic clock signal which is generated externally and which is highly accurate with respect to frequency and balance and which is received by the BOST chip 10 (the latter concept is not shown in the figure, yet could be implemented without difficulty). The clock signal clk_out generated in the BOST chip 10 is forwarded directly to the DUT 20 via an output pin. In the immediate vicinity of the DUT 20, a tap 17 is provided at which the same clock signal clk_out is picked up and supplied back to the BOST chip 10 via a feedback circuit 18 as input clock signal clk_in. The output clock signal clk_out is connected in parallel to a first DLL (delay-locked loop) circuit 3 which has a programmable delay. It is known that precise phase shifts can be implemented by means of such DLL circuits. The DLL circuit 3 forms a timing reference circuit which generates timing reference signals DLL_DQ_drv, DLL_DQS_dr, DLL_addr_drv, in order to generate a mutually. independent programmable delay of controllable transmit drivers 4a, 6a and 9 in each case for signal groups DQ, DQS and addr/cmd.

For latching-in of the DQ response signals received at the receiver elements 4b from the DUT 20 is delayed in time by means of a similar method by means of a DLL circuit 5. For this purpose, the clock signal clk_in, which is picked up at the tap 17 in the vicinity of the DUT 20 and is input to the BOST chip, is supplied to a second DLL circuit 5 which generates from this a programmable delay timing reference signal DLL_DQ_rcv for latching the DQ signals received at the DQ receiver units 4b accurately timed into a buffer latch 7. It should be mentioned that the timing of DQ values from DUT 20 is specified with respect to the clock signal clk_out going to the DUT 20. By feeding the timing reference back by means of the clock signal clk_in, the signal of the DQ data read develops in the same sense as the input clock signal CLK_in.

This makes it possible to measure the accurately timed arrival of the DQ response signals at the BOST chip 10 with maximum accuracy with respect to the clk_in signal since delay effects have been eliminated.

The figure also shows registers or buffers 11–14 for storing delay parameters DQS_del, DQ_drv_del and addr/cmd_del for the first DLL circuit 3 and a delay parameter DQ_rcv_del for the second DLL circuit 5. The delay parameters in the registers 11–14 can be generated in the BOST chip 10 itself or can be programmed into the registers 11–14, for example as start or basic delay parameters, from the testing device 30 (also referred to as the test equipment). Furthermore, data registers 15 and 16 for buffering DQS and DQ data to be sent to the DUT are shown.

The DQ response signals from the DUT 20, which are buffered in the latch 7, can be evaluated either directly in the BOST chip 10 or indirectly in the testing device 30, for example with respect to their timing, pattern content and amplitude. The figure also shows a multiplexer 8 which multiplexes between the timing reference signal DLL_DQ_rcv and the data strobe response signal DQS received at the receiver elements 6b from the DUT 20, depending on whether SDR mode or DDR mode is provided.

The above description clearly shows that due to the feedback according to the invention of the clk_out signal, picked up at tap 17 in the vicinity of the DUT 20, in the form of the signal clk_in to the second DLL circuit 5 which generates from this timing reference signal DLL_DQ_rcv for latching in the data response signals DQ from the DUT 20, delay effects of the signal lines between BOST chips 10 and DUT 20 are eliminated. Due to the common drive and evaluation of signal groups by different timing reference signals generated by the programmable DLL delay circuits, an inexpensive test system can be implemented, especially for testing DRAM memory chips in a BOST chip. Due to its inexpensive construction, one BOST chip 10 can be in each case spatially associated with one DUT 20 to be tested and arranged in closed vicinity to the latter during parallel testing of a number of synchronous semiconductor chips which provides for a higher degree of parallelism and accuracy during the test.

We claim:

1. A system for testing fast synchronous semiconductor circuits, comprising:
   a testing device connected via a signal path to a semiconductor circuit to be tested, the semiconductor circuit to be tested being connected to receive test signals selected from the group consisting of test data signals, control signals, address signals and timing reference and clock signals generated in dependence on signal conditions defined by said testing device, and the semiconductor circuit to be tested generating response signals in response to the test signals;
   a semiconductor circuit chip connected in said signal path between said testing device and the semiconductor circuit to be tested and spatially associated with the semiconductor circuit to be tested, said semiconductor circuit chip containing a timing reference circuit for generating timing reference signals with a programmable phase angle and forming a timing reference for the test signals and the response signals, and circuits for generating the test signals and for evaluating the response signals received from the semiconductor circuit being tested, said timing reference circuit including first and second DLL circuits with programmable delay;
   a tap in close vicinity to the semiconductor circuit to be tested, said tap carrying the clock signal generated by said semiconductor circuit chip and sent to the semiconductor circuit to be tested; and
   a feedback circuit for feeding the clock signal back from said tap to said second DLL circuit.

2. The test system according to claim 1, wherein the semiconductor circuit to be tested is a semiconductor memory chip.

3. The test system according to claim 1, wherein said semiconductor circuit chip contains a clock generator for generating a clock signal with highly accurate frequency and balance for generating the timing reference signals by said timing reference circuit.

4. The test system according to claim 1, wherein said semiconductor circuit chip receives an externally generated basic clock signal with highly accurate frequency and symmetry, and said timing reference circuit is configured to derive the timing reference signals from the external basic clock signal.

5. The test system according to claim 1, wherein said semiconductor circuit chip includes a first controllable transmit driver and a first controllable receiver respectively provided for transmitting data words written from said semiconductor circuit chip to the semiconductor circuit to be tested and for receiving data words read out of the semiconductor circuit to be tested by said semiconductor circuit chip, and wherein a timing of said first transmit driver and said first receiver is controlled by a first and a second timing reference signal in each case generated by said timing reference circuit.

6. The test system according to claim 5, wherein said semiconductor circuit chip further includes a second controllable transmit driver for address and command signals to be sent to the semiconductor circuit to be tested, and wherein a timing of said second transmit driver is controlled by a third timing reference signal generated by said timing reference circuit.

7. The test system according to claim 6, wherein said semiconductor circuit chip further includes a third controllable transmit driver and a third controllable receiver for data strobe signals to be written to the semiconductor circuit to be tested, and data strobe signals to be read out of the semiconductor circuit to be tested by said semiconductor chip, and wherein a timing of said third transmit driver and said third receiver is controlled by a fourth timing reference signal generated by said timing reference circuit.

8. The test system according to claim 1, wherein said semiconductor circuit chip further includes storage registers, each for storing a programming value for programming a delay of said timing reference circuit.

9. The test system according to claim 8, wherein said storage registers are connected to be loaded with a basic value from said testing device.

10. The test system according to claim 5, wherein said timing reference circuit is configured to synchronize the second timing reference signal generated for said first receiver with the clock signal received from said feedback circuit.

* * * * *